United States Patent
Shieh et al.

(10) Patent No.: US 9,240,437 B2
(45) Date of Patent: Jan. 19, 2016

(54) FLEXIBLE TFT BACKPANEL BY GLASS SUBSTRATE REMOVAL

(71) Applicants: Chan-Long Shieh, Paradise Valley, AZ (US); Fatt Foong, Goleta, CA (US); Gang Yu, Santa Barbara, CA (US); Guangming Wang, Santa Barbara, CA (US)

(72) Inventors: Chan-Long Shieh, Paradise Valley, AZ (US); Fatt Foong, Goleta, CA (US); Gang Yu, Santa Barbara, CA (US); Guangming Wang, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 50 days.

(21) Appl. No.: 14/216,920

(22) Filed: Mar. 17, 2014

(65) Prior Publication Data

US 2015/0263078 A1    Sep. 17, 2015

(51) Int. Cl.
| | |
|---|---|
| H01L 21/84 | (2006.01) |
| H01L 27/32 | (2006.01) |
| H01L 51/00 | (2006.01) |
| H01L 27/12 | (2006.01) |
| H01L 29/786 | (2006.01) |
| H01L 51/56 | (2006.01) |
| H01L 51/52 | (2006.01) |

(52) U.S. Cl.
CPC ........ *H01L 27/3244* (2013.01); *H01L 27/1259* (2013.01); *H01L 27/322* (2013.01); *H01L 29/78603* (2013.01); *H01L 51/0097* (2013.01); *H01L 51/5246* (2013.01); *H01L 51/56* (2013.01); *H01L 2227/323* (2013.01); *H01L 2251/5338* (2013.01)

(58) Field of Classification Search
CPC ............ H01L 27/3244; H01L 29/8603; H01L 51/0097; H01L 51/5246
See application file for complete search history.

(56) References Cited

U.S. PATENT DOCUMENTS

| | | | | | |
|---|---|---|---|---|---|
| 5,817,550 | A | * | 10/1998 | Carey | .................... H01L 21/268 257/E21.119 |
| 6,225,149 | B1 | * | 5/2001 | Gan | .................. H01L 29/66765 257/E21.414 |
| 6,362,027 | B1 | * | 3/2002 | Yamazaki | ............... H01L 27/12 257/E21.413 |

* cited by examiner

*Primary Examiner* — Richard Booth
(74) *Attorney, Agent, or Firm* — Robert A. Parsons; Michael W. Goltry; Parsons & Goltry

(57) ABSTRACT

A process of fabricating a flexible TFT back-panel on a glass support includes a step of providing a flat glass support member sufficiently thick to prevent bending during the processing. A layer of etch stop material is positioned on the upper surface of the glass support member and an insulating buffer layer is positioned on the layer of etch stop material. A TFT back-panel is positioned on the insulating buffer layer and a flexible plastic carrier is affixed to the TFT back-panel. The glass support member is etched away, whereby a flexible TFT back-panel is provided. The TFT back-panel can include a matrix of either OLED cells or LCD cells.

20 Claims, 2 Drawing Sheets

FLEXIBLE TFT BACKPANEL BY GLASS SUBSTRATE REMOVAL

FIELD OF THE INVENTION

This invention generally relates to a method of fabricating a flexible TFT back-panel and more specifically to the use of a glass substrate and the subsequent removal thereof.

BACKGROUND OF THE INVENTION

There is a strong interest in flexible TFT back-panels (including insulation and hermetic sealing, if required) because of the strong interest in wearable electronics with high information content displays and/or sensors. The key challenge in this technology is the processing substrate. To produce good electrical performance, the processing substrate has to survive high temperature and all kinds of chemical treatments without deformation. Furthermore, the processing substrate has to remain flat for lithography purposes. No flexible substrate can achieve these requirements. The only solution is to mount the flexible TFT back-panel onto a rigid glass support using an adhesive for processing purposes and removing the flexible TFT back-panel from the glass support by de-bonding after the processing is complete. There are a lot of challenges in finding the adhesive material and the suitable flexible TFT back-panel that can maintain the necessary dimensional stability.

For most flexible substrates the coefficient of thermal expansion (CTE) is 50 to 100 ppm per degree Celsius, but for glass substrates the CTE is only a few ppm per degree Celsius. For temperature excursions of 300 degrees Celsius the deformation in plastic substrates can be as large as a few percent. Thus, to hold the shape when using a glass support with a flexible TFT back-panel there will be a strong stress to bend the glass. The thicker the material used in the TFT back-panels, the stronger the force tending to bend the glass support. For typical TFT back-panels including plastic of 100 to 200 microns thick (e.g. insulating layers), the force is so strong even the glass substrate is bent. Therefore, it is advantageous to use a plastic material that is as thin as possible. For handling purposes a plastic substrate added to the TFT back-panel has to be sufficiently thick to deal with the handling after the de-bonding.

The de-bonding process is also tedious and can require high temperature or laser illumination. Also, the de-bonding process can damage the back plane and may not be compatible with display/sensor device processing, such as the fabrication of OLED or organic photodiodes. For example, OLEDs or photodiodes cannot survive temperatures over 100 degrees Celsius. Even finished LCD cells cannot survive the high temperature that is required for de-bonding. Such limitations can force the de-bonding process to be carried out before the display/sensor device processing. However, if the flexible substrate/glass support is de-bonded before the display/sensor device processing, the display/sensor device processing has to be carried out on the flexible substrate, which is more difficult to handle. Because of these problems and others, it is very difficult to fabricate good flexible backplanes and flexible displays/sensors with high information content.

The advance of metal oxide thin film transistors (MOTFT) enables high performance TFTs to be made at lower temperatures. However, the decrease in performance and stability in MOTFETs is still an issue even for MOTFETs made at low temperature. Therefore, it is advantageous to be able to make flexible backplanes at high temperatures up to 300 degrees Celsius. Thus, the use of a rigid supporting element to hold a flexible substrate rigid during processing is still desirable.

In the prior art various attempts to fabricate flexible substrates on glass supports have been made. One example is described in U.S. Pat. No. 8,258,694, entitled "Method for Manufacturing Flexible Display Device Having an Insulating Overcoat and Flexible Display Device Having the Same", issued Sep. 4, 2012 and a divisional thereof, U.S. Pat. No. 8,257,129. In this type of process, an insulating protection layer is formed on a rigid substrate (e.g. glass). Display elements are formed on the insulating protection layer and a flexible substrate is formed in an overlying relationship on the display elements. The rigid substrate is then removed by etching or the like. To perform the etching step, the material of the rigid substrate must have at least an etching selectivity 20 times greater than the insulating protection layer. It is important to note that the insulating protection layer does not stop the etching but is only etched at a much slower rate. That is to say, in all known prior art some of the insulating protection layer is removed in the process of etching the glass substrate. Since the amount removed affects the efficiency of the insulating protective layer (i.e. the protection provided by the layer) some compensation must be provided in advance. However, forming a thicker insulating protection layer in advance increases the stress on the glass substrate. Generally, many of these prior art fabrication methods have either been extremely difficult to use, usually because of the severe requirement for the selection of materials, or have failed completely because the etching step is too rigorous.

It would be highly advantageous, therefore, to remedy the foregoing and other deficiencies inherent in the prior art.

Accordingly, it is an object of the present invention to provide a new and improved process for fabricating a flexible TFT back-panel on a glass support.

It is another object of the present invention to provide a new and improved process for fabricating a flexible TFT back-panel on a glass support member wherein a step of etching the glass support member is greatly simplified in both the etching process and the selection of materials.

It is another object of the present invention to provide a new and improved process for fabricating a flexible TFT back-panel on a glass support member wherein a step of etching includes the use of reusable noble metals to greatly reduce the cost.

It is another object of the present invention to provide a new and improved flexible TFT back-panel on a glass support.

SUMMARY OF THE INVENTION

The desired objects of the instant invention are achieved in accordance with a process of fabricating a flexible TFT back-panel on a glass support including a step of providing a flat glass support member sufficiently thick to prevent bending during the processing. A layer of etch stop material is positioned on the upper surface of the glass support member and an insulating buffer layer is positioned on the layer of etch stop material. A TFT back-panel is positioned on the insulating buffer layer and a flexible plastic carrier is affixed to the TFT back-panel. The glass support member is etched away after panel processing, whereby a flexible TFT back-panel is provided. The TFT back-panel can include a matrix of either OLED cells or LCD cells. The TFT back-panel can also include a matrix of biosensors sensitive to vibration from subsonic to ultrasonic/supersonic (such as micro-electro-mechanical sensors, MEMS), and radiation detectors from far infrared to X-ray wavelength.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
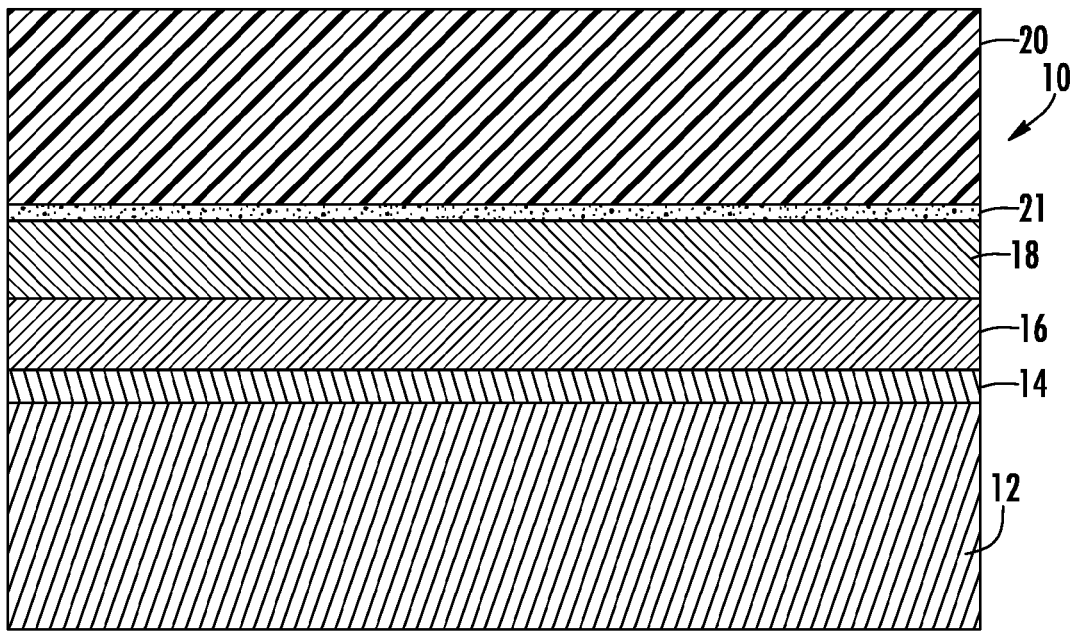
FIG. 1 is a simplified layer diagram of steps in the fabrication of a flexible TFT back-panel on a glass support member, in accordance with the present invention.
Figure 2:
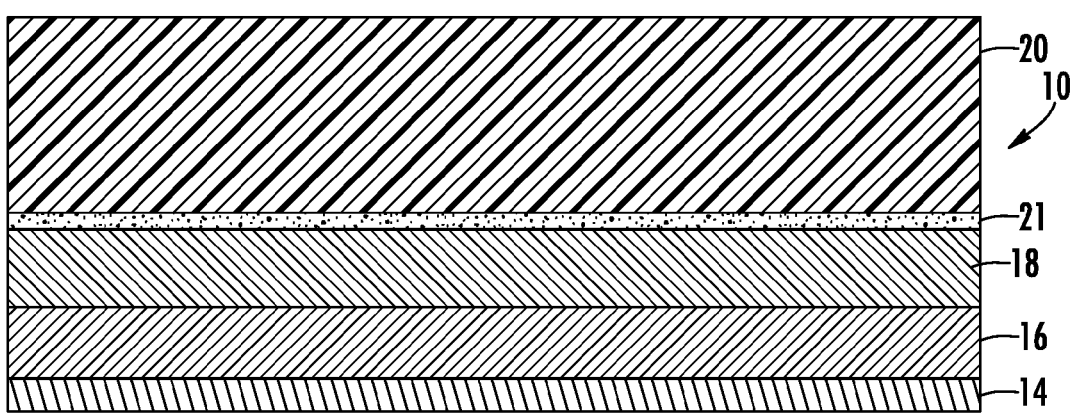
FIG. 2 is a simplified layer diagram of the flexible TFT back-panel after removal of the glass support member.

Turning to FIG. 1, various steps in a fabrication process for a flexible TFT back-panel 10 are illustrated. In this specific instance a rigid support member (hereinafter substrate 12) includes a flat glass panel, which is a preferred support member and will be used as an example herein although other materials may be used in specific applications. It should also be understood that the thickness of glass substrate 12 is not critical except that it must be thick enough to prevent any bending during the fabrication process and will generally be as thin as practical to reduce the ultimate etching time.

An etch stop layer 14 is deposited on glass substrate 12 and includes any material that will stop the etching process once glass substrate 12 has been removed. As is known in the art, etching of glass substrate 12 is best performed by hydrofluoric acid (HF) and the best etch stop material is a thin layer of noble metal, such as Au, Pt, Pd, or a thin layer of transition metal in 5B and 6B columns of the periodic table, such as V, Nb, Ta, Cr, Mo, and W, and mixtures or multilayer stacks thereof. In some instances it may be desirable to enhance the adhesion of the layer of noble metal to overlying and underlying materials. Such enhancement can be provided by optional thin glue layers (not visible within layer 14) such as Cr, Ti, Ni, or mixtures thereof applied to the top and/or bottom of layer 14. It should be specifically noted that once glass substrate 12 is removed any noble metal (e.g. Au used in etch stop layer 14) can be recycled or reclaimed to reduce the cost.

Another option for etch stop layer 14 is a thin layer of amorphous silicon (a-Si) deposited on glass substrate 12 by PECVD. It should be noted that a-Si itself cannot survive the HF etch process. However, by thermally crystallizing the a-Si into poly-Si at a temperature above 500° C., the resulting poly-Si can survive the HF etch process. Since the crystallization step is carried out before any additional layer deposition and TFT processing, the high temperature step does not cause any problem.

Etch stop layer 14 should be as thin as possible to reduce the time required for application and removal, if required or preferred. It has been found that a thickness of less than 200 nm provides sufficient protection and, preferably, etch stop layer 14 is 100 nm or thinner. Here it should be noted that in the prior art, even with the glass substrate having an etching selectivity 20 times greater than the insulating protection layer, the insulating protection layer would have to be much thicker than 200 nm to withstand the etching removal of the glass substrate.

An insulating buffer layer 16 (i.e. an insulating protection layer) is deposited on etch stop layer 14 by any convenient process, such as spin coating, slot coating, or plasma enhanced CVD. Insulating buffer layer 16 can be deposited directly on etch stop layer 14 since there is no need for glue or other adhesive materials (except for the optional Cr, Ti, Ni, or mixtures mentioned above used to enhance the adhesion). Generally, insulating buffer layer 16 is chosen so that it can survive MOTFT process temperatures up to 300 degrees Celsius, since it is advantageous to be able to process MOTFTs at temperatures up to 300 degrees Celsius for improved characteristics. Some well-known insulating materials that have this property include, for example, polyimide, bisbenzocyclobutene (BCB), and polytetrafluroethylene (PTFE), or the like, any of which can be deposited by spin coating, slot coating, spray coating, or screen printing. Other insulating materials, such as hexamethuldisiloxane (HMDSO), $SiO_2$ and SiN can be deposited by plasma enhanced chemical vapor deposition (PECVD). The thickness of insulating buffer layer 16 is sufficiently thin (e.g. preferably 1 to 5 microns) so that glass support member 12 will remain flat (i.e. deformation is negligible) during high processing temperatures. It must be noted that for layer 16 to be formed of an effective insulating buffer material and sufficiently thin to prevent unworkable deformations of glass substrate 12, it cannot survive the subsequent etching removal of glass support member 12 by itself.

Because etch stop layer 14 is interposed between glass substrate 12 and insulating buffer layer 16, no etching or removal of insulating buffer layer 16 occurs during the step of etching glass substrate 12. Thus, it should be specifically noted that insulating buffer layer 16 can be formed initially with the optimum thickness required for insulation purposes so that stress on glass substrate 12 during the processing steps can be minimized and accuracy during lithography or other alignment procedures is enhanced. Also, insulating buffer layer 16 can be formed of optimum insulating materials, since they do not have to withstand any of the etching process.

A TFT backplane 18 is formed on insulating buffer layer 16 by any well-known process. As understood in the art, a TFT backplane includes a matrix of TFT switching circuits formed to mate with a matrix of light emitting or light modulating elements and generally organized to define a matrix of full color pixels. Generally, the light emitting or light modulating elements include organic light emitting devices (OLED) or liquid crystal devices (LCD) and full color can be achieved in a variety of embodiments, as explained, for example, in a copending U.S. patent application entitled "Full Color Active Matrix Organic Light Emitting Display with Hybrid", filed 28 Jun. 2011, bearing Ser. No. 13/170,382, and incorporated herein by reference. The matrix of TFT switching circuits and mating matrix of light emitting or light modulating elements may also be replaced with a plurality of light sensor devices using photodiodes, radiation detectors or any array of MEMS devices or the like in a well-known fashion to form a variety of sensor arrays. In the present structure, all of the matrix of TFT switching circuits and the mating matrix of light emitting or light modulating elements as well as any color filters or other elements making up the display or sensor device are included in the term "backplane TFT" 18.

After the backplane and display/sensor devices are fabricated, additional packaging structure is formed on the upper surface thereof. In this specific example the additional packaging structure is a flexible plastic carrier 20. Flexible plastic carrier 20 is thick enough to act as the mechanical support for the display/sensor device after glass substrate 12 is removed. Also, the top side of the display/sensor device is protected by flexible plastic carrier 20. In most instances a coating 21 of adhesive material (e.g. glue or the like) is applied to the upper surface of TFT backplane 18 to fixedly attach flexible plastic carrier 20 thereto. In applications requiring high barrier properties for plastic carrier 20, a barrier coating at the interface between carrier 20 and coating 21 or at both surfaces of carrier 20 can be added.

With flexible plastic carrier 20 fixedly attached to TFT backplane 18, Glass substrate 12 can be removed. For the removal process the whole structure is put into an HF bath with proper agitation. If flexible plastic carrier 20 is not resistant to HF, the sides and top of the package can be protected by an additional resist material, generally one that is easily removed after glass substrate 12 has been removed. Once glass substrate 12 is removed, etch stop layer 14 can be removed by a different etching process when light transmission from the bottom side is desirable. For example, when Au is used as etch stop layer 14 it may block light from the display elements and, in addition, will save money by removing and reusing the material. When etch stop layer 14 is a thin poly-silicon film it is generally transparent to light emission and may simply be left in place. However, since some light may be blocked it is preferable to remove the poly-silicon layer. When removing is desirable, the poly-silicon can be removed by fluorine based dry etching. Since packaging and glass substrate removal are carried out at low temperatures (<100 degrees Celsius), there are more options in material selection for flexible plastic carrier 20.

In the example where TFT backplane 18 includes OLED devices requiring hermetic sealing, multiple alternating layers of metal, such as Al, Mo, Ti, Ta, Cu, and combinations thereof, and organic material, such as polyimide, BCB, PTFE, or bolaamphiphiles oligomers can be used as insulating buffer layer 16. Since insulating buffer layer 16 is protected from the HF glass substrate removal by etch stop layer 14, materials that can be used in insulating buffer layer 16 are greatly expanded which in turn expands the type of TFT backplane 18 that can be used.

Figure 3:
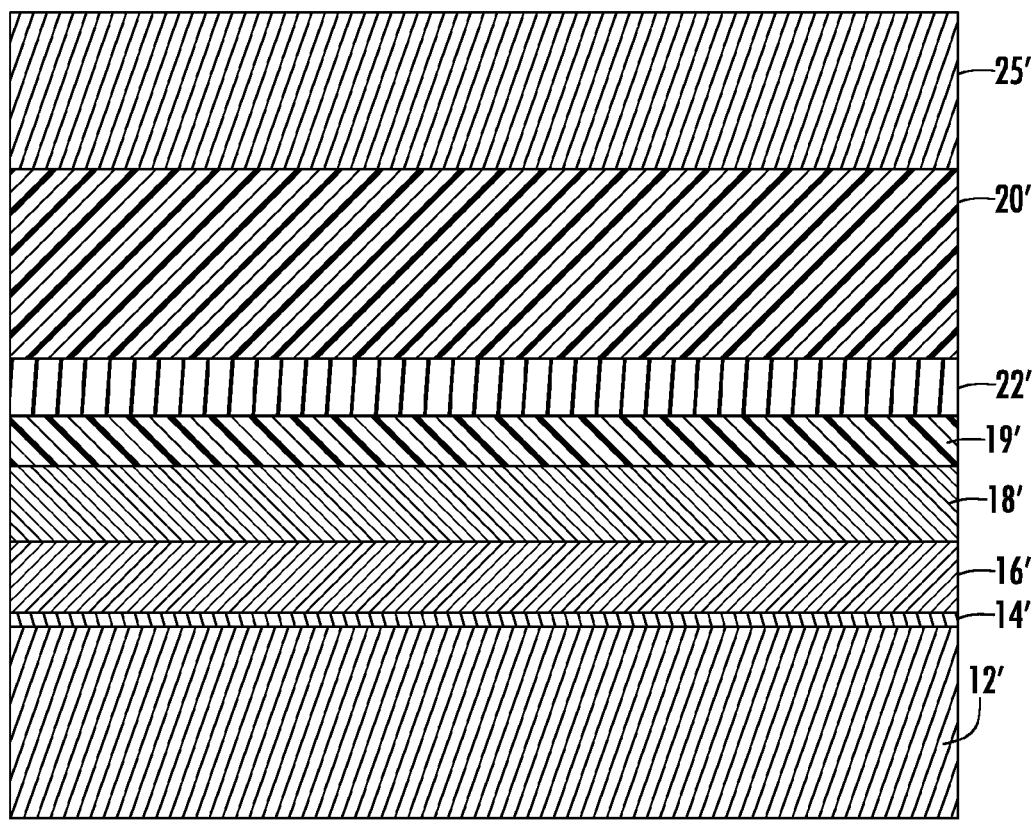
FIG. 3 is a simplified layer diagram of steps in the fabrication of a flexible LCD back-panel on a glass support member, in accordance with the present invention.

For LCD elements in TFT backplane 18 it is difficult to make a substrate whose refractive index is isotropic in all polarizations. Therefore, it is important that all structures sandwiched between polarizers are isotropic. Referring specifically to FIG. 3, the same basic components are used that are described above with relation to FIG. 1, except that a prime (') is added to the designated numbers to indicate a different embodiment. Thus, a glass substrate 12' has a layer 14' of etch stop material deposited thereon, with an insulating buffer layer 16' positioned thereon and a TFT backplane 18' formed on insulating layer 16'. A matrix of LCD cells 19' is formed on TFT backplane 18' and may be considered a component of backplane 18' (as explained above).

Figure 4:
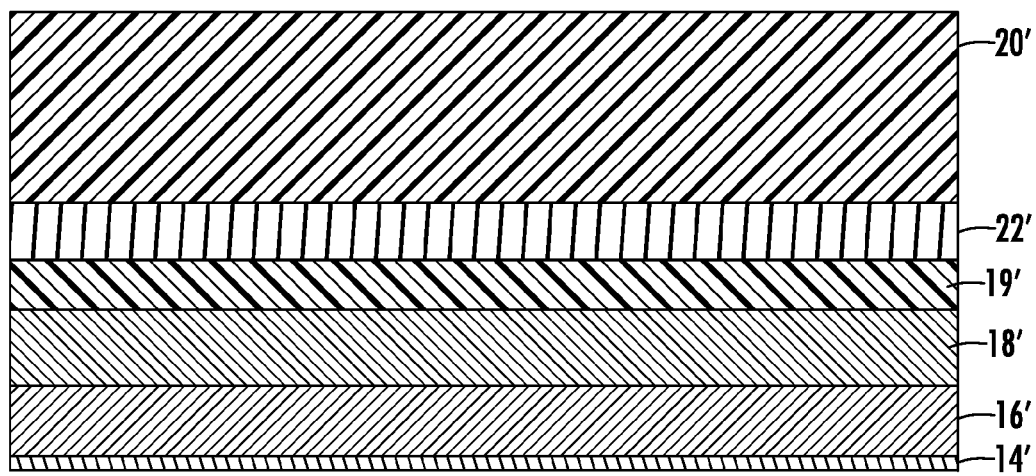
FIG. 4 is a simplified layer diagram of the flexible LCD back-panel after removal of glass support members.

In this specific embodiment one additional glass plate or substrate 25' is used to pattern a color filter. A plastic carrier 20' is laminated onto glass plate 25' by, for example, some adhesive such as glue or the like. Plastic carrier 20' is similar to plastic carrier 20 described above. A polarizer film 22' is laminated or otherwise formed on plastic carrier 20'. Color filters and black matrices are patterned onto polarizer film 22', which generally is performed at low temperatures and does not require good alignment accuracy. The structure is then laminated onto the matrix of LCD cells 19' as illustrated in FIG. 3. Both glass substrate 12' and glass plate 25' can then be removed by an HF bath, as described above, after protecting the edges of the apparatus. The remainder is a flexible LCD structure as illustrated in FIG. 4. A polarized backlight can then be attached to etch stop layer 14', or to buffer layer 16' if etch stop layer 14' is removed, to complete the LCD display.

Alternatively, color filters and black matrix patterned layers can be formed on the back-panel substrate side, above or beneath the TFT structures in layer 18'. In this approach, no patterning is needed on the polarizer side above LCD layer 19', so that in this case the supporting glass layer 25' can be optional.

Thus, a new and improved process for fabricating a flexible TFT back-panel on a glass support is disclosed. The new and improved process includes steps wherein etching the glass support member is greatly simplified in both the etching process and the selection of materials. Since an etch stop layer is included in addition to an insulating buffer layer, the choice of materials used in the insulating buffer layer is greatly expanded. Also, by expanding the choice of materials that can be used in the insulating buffer layer, the layer can be thinner so that less bending stress will be applied to the glass substrate and, consequently, the glass substrate can be made thinner which will substantially reduce the final glass etching process. Further, when noble metals, such as gold, or transition metals such as V, Nb, Ta, Cr, Mo, or W, are used in the etch stop layer, the material can be reclaimed and reused after etching the glass substrate to further reduce the cost of the process.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A process of fabricating a flexible TFT back-panel on a glass support comprising the steps of:
   providing a flat glass support member having an upper surface;
   positioning a layer of etch stop material on the upper surface of the glass support member;
   positioning an insulating buffer layer on the layer of etch stop material;
   positioning a TFT back-panel on the insulating buffer layer;
   affixing a flexible plastic carrier to the TFT back-panel; and
   etching the glass support member away, whereby a flexible TFT back-panel is provided.

2. A process as claimed in claim 1 wherein the step of positioning the layer of etch stop material includes positioning a layer with a thickness less than 200 nm.

3. A process as claimed in claim 1 wherein the step of positioning the layer of etch stop material includes positioning a layer with a thickness of 100 nm or less.

4. A process as claimed in claim 1 wherein the step of positioning the layer of etch stop material includes positioning one of a layer of noble metal, a layer of transition metal in the 5B or 6B column of the periodic table, and a layer of poly-silicon.

5. A process as claimed in claim 4 wherein the etch stop layer includes noble metal and further including a step of reclaiming the noble metal subsequent to the step of etching the glass support member away.

6. A process as claimed in claim 4 wherein the etch stop layer includes poly-silicon and the step of positioning the layer of poly-silicon includes the steps of depositing a layer of amorphous silicon (a-Si) on the upper surface of the flat glass support member and crystallizing the amorphous silicon (a-Si) into poly-Si at a temperature above 500° C. prior to the step of positioning the insulating buffer layer.

7. A process as claimed in claim 1 wherein the step of positioning the TFT back-panel includes positioning a matrix of one of OLED cells, LCD cells, photosensor elements, radiation sensor elements, or MEMS elements.

8. A process as claimed in claim 7 wherein the TFT back-panel includes a matrix of OLED cells and the step of positioning the insulating buffer layer includes forming a hermetic seal protecting the OLED cells.

9. A process as claimed in claim 1 wherein the step of positioning the TFT back-panel includes positioning a color filter, whereby the flexible TFT back-panel is a full color display.

10. A process as claimed in claim 1 wherein the step of positioning the insulating buffer layer includes forming a layer of material capable of withstanding temperatures up to 300 degrees Celsius.

11. A process as claimed in claim 10 wherein the step of positioning the insulating buffer layer includes forming the insulating buffer layer of one of polyimide, bisbenzocyclobutene (BCB), polytetrafluroethylene (PTFE), or bolaamphiphiles oligomers deposited by one of spin coating, spray coating, or screen printing.

12. A process as claimed in claim 10 wherein the step of positioning the insulating buffer layer includes forming the insulating buffer layer of one of hexamethuldisiloxane (HMDSO), SiO2 and SiN deposited by plasma enhanced chemical vapor deposition (PECVD).

13. A process of fabricating a flexible TFT back-panel on a glass support comprising the steps of:
providing a flat glass support member having an upper surface;
positioning a layer of etch stop material on the upper surface of the glass support member, the layer of etch stop material including one of a layer of noble metal and a layer of poly-silicon;
positioning an insulating buffer layer on the layer of etch stop material;
positioning a TFT back-panel on the insulating buffer layer, the TFT back-panel including one of a matrix of OLED cells or LCD cells, and a color filter, whereby a full color display is provided;
affixing a flexible plastic carrier to the TFT back-panel; and
etching the glass support member away, whereby a flexible TFT back-panel is provided.

14. A process as claimed in claim 13 wherein the etch stop layer includes noble metal and further including a step of reclaiming the noble metal subsequent to the step of etching the glass support member away.

15. A process as claimed in claim 13 wherein the etch stop layer includes poly-silicon and the step of positioning the layer of poly-silicon includes the steps of depositing a layer of amorphous silicon (a-Si) on the upper surface of the flat glass support member and crystallizing the amorphous silicon (a-Si) into poly-Si at a temperature above 500° C. prior to the step of positioning the insulating buffer layer.

16. A process as claimed in claim 13 wherein the TFT back-panel includes a matrix of OLED cells and the step of positioning the insulating buffer layer includes forming a hermetic seal protecting the OLED cells.

17. A process as claimed in claim 13 wherein the step of positioning the insulating buffer layer includes forming a layer of material capable of withstanding temperatures up to 300 degrees Celsius.

18. A process as claimed in claim 17 wherein the step of positioning the insulating buffer layer includes forming the insulating buffer layer of one of polyimide, bisbenzocyclobutene (BCB), polytetrafluroethylene (PTFE), or bolaamphiphiles oligomers deposited by one of spin coating, spray coating or screen printing.

19. A process as claimed in claim 17 wherein the step of positioning the insulating buffer layer includes forming the insulating buffer layer of one of hexamethuldisiloxane (HMDSO), SiO2 and SiN deposited by plasma enhanced chemical vapor deposition (PECVD).

20. A process of fabricating a flexible TFT back-panel on a glass support comprising the steps of:
providing a flat glass support member having an upper surface;
positioning a layer of etch stop material on the upper surface of the glass support member, the layer of etch stop material selected to stop HF etch and including one of a layer of noble metal and a layer of poly-silicon;
positioning an insulating buffer layer on the layer of etch stop material;
positioning a TFT back-panel on the insulating buffer layer, the TFT back-panel including one of a matrix of OLED cells or LCD cells, and a color filter, whereby a full color display is provided;
affixing a flexible plastic carrier to the TFT back-panel; and
using an HF etch removing the glass support member from the structure, whereby a flexible TFT back-panel is provided.

* * * * *